(12) United States Patent
Ma et al.

(10) Patent No.: US 6,229,216 B1
(45) Date of Patent: May 8, 2001

(54) SILICON INTERPOSER AND MULTI-CHIP-MODULE (MCM) WITH THROUGH SUBSTRATE VIAS

(75) Inventors: Qing Ma, San Jose; Harry Fujimoto, Sunnyvale, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/228,323

(22) Filed: Jan. 11, 1999

(51) Int. Cl.[7] .......................... H01L 23/10; H01L 23/34; H01L 23/48
(52) U.S. Cl. .................. 257/777; 257/698; 257/712; 257/720; 257/722
(58) Field of Search ............................ 257/779, 693, 257/698, 738, 777, 778, 712, 720, 722; 228/180.22; 438/108

(56) References Cited

U.S. PATENT DOCUMENTS

| | | | |
|---|---|---|---|
| 4,612,083 | * 9/1986 | Yasumoto et al. | 156/633 |
| 5,191,224 | * 3/1993 | Tazunoki et al. | 257/724 |
| 5,480,834 | * 1/1996 | Lake et al. | 438/108 |
| 5,705,851 | * 1/1998 | Mostafazadeh et al. | 257/675 |
| 5,786,701 | * 7/1998 | Pedder | 324/754 |

FOREIGN PATENT DOCUMENTS

| | | | | |
|---|---|---|---|---|
| 59-52859 | * | 3/1984 | (JP) | 257/777 |
| 5-82711 | * | 4/1993 | (JP) | 257/778 |

* cited by examiner

*Primary Examiner*—David Hardy
*Assistant Examiner*—Jhihan B Clark
(74) *Attorney, Agent, or Firm*—Blakely, Sokoloff, Taylor & Zafman LLP

(57) ABSTRACT

An integrated circuit package which includes an integrated circuit that is connected to a silicon substrate. The silicon substrate may have a via. The package may further include a solder bump that is attached to both the integrated circuit and the silicon substrate. The silicon substrate has a coefficient of thermal expansion that matches the coefficient of thermal expansion of the integrated circuit.

15 Claims, 3 Drawing Sheets

SILICON INTERPOSER AND MULTI-CHIP-MODULE (MCM) WITH THROUGH SUBSTRATE VIAS

BACKGROUND OF THE INVENTION

1. Field of the Invention

The present invention relates to an integrated circuit package.

2. Background Information

Integrated circuits are typically assembled into packages that are soldered to a printed circuit board. Each integrated circuit may be connected to a substrate of the package with a number of solder bumps in a process commonly referred to as controlled collapsed chip connection (C4).

During operation, the integrated circuit generates heat which raises the temperature of the package. Additionally, the package temperature may be increased during assembly of the package. The increase in package temperature will cause the integrated circuit and the substrate to expand. The substrate is typically constructed as a composite of metal and organic material which have a different coefficient of thermal expansion than the silicon material of the integrated circuit. The mismatch of thermal expansion coefficients may create stresses in the solder bumps when the package is thermally cycled. The stresses may create cracks and electrical opens in the package.

To improve the structural integrity of the solder bumps an epoxy can be dispensed into the integrated circuit/substrate interface. Even with the epoxy underfill it has been found that the substrate may delaminate and crack when the package is thermally cycled. It would be desirable to provide a substrate for a C4 integrated circuit package which has a coefficient of thermal expansion that matches the coefficient of thermal expansion of the integrated circuit.

During operation the integrated circuit generates heat which must be removed from the package to maintain the circuit junction temperatures below a threshold value(s). Heat slugs and heat spreaders are sometimes incorporated into the package to facilitate the removal of heat from the integrated circuit. Heat slugs and heat spreaders may not be adequate to effectively remove all of the heat from a high powered integrated circuit such as a microprocessor. Some of the heat may transfer through the package substrate and into the printed circuit board. Organic substrates of the prior art have a relatively low coefficient of thermal conductivity. It would be desirable to provide a substrate which has both a coefficient of thermal conductivity that is higher than organic substrates of the prior art and have a coefficient of thermal expansion that matches the integrated circuit.

SUMMARY OF THE INVENTION

One embodiment of the present invention is an integrated circuit package which includes an integrated circuit that is connected to a silicon substrate. The silicon substrate may have a via. The package may further include a solder bump that is attached to both the integrated circuit and the silicon substrate.

DETAILED DESCRIPTION

Figure 1:
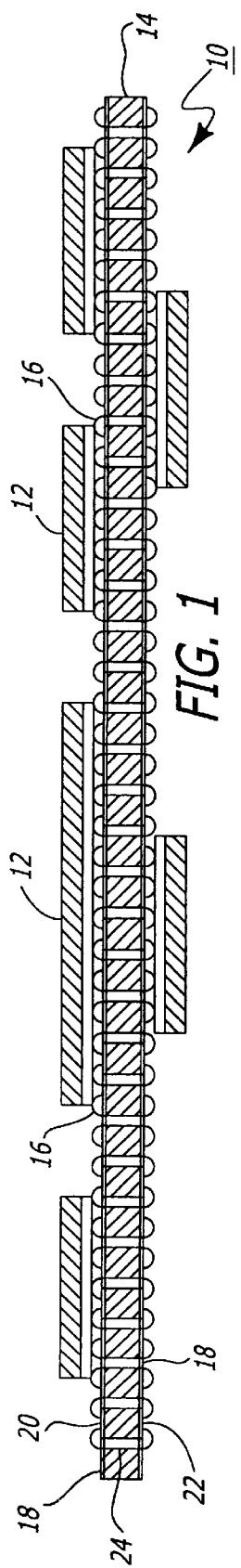
FIG. 1 is a side sectional view of an embodiment of an electronic package of the present invention.

Referring to the drawings more particularly by reference numbers, FIG. 1 shows an embodiment of an electronic package 10 of the present invention. The package 10 may include a plurality of integrated circuits 12 that are connected to a silicon substrate 14. The integrated circuits 12 may be connected to the substrate 14 by solder bumps 16 with a process commonly referred to as controlled collapsed chip connection (C4).

The substrate 14 is constructed from silicon which has a coefficient of thermal expansion that matches the coefficient of thermal expansion of the integrated circuits. When the package 10 is thermally cycled the integrated circuit 12 and the substrate 14 expand at approximately the same rate. The matched expansion reduces the stresses on the solder bumps 16 over prior art packages which incorporate substrates that do not have a coefficient of thermal expansion that matches. Additionally, silicon has a higher coefficient of thermal conductivity than organic substrates of the prior art and thus provides a thermal path which has a lower thermal impedance than an organic substrate.

The package 10 may include interconnect layers 18 of contact pads and routing traces located on a first surface 20 and a second surface 22 of the substrate 14. The interconnect layers 18 may be connected by vias 24 that extend from the first surface 20 to the second surface 22. The interconnect layers 18 connect the integrated circuits 12.

The package 10 may include an epoxy underfill material (not shown) that is located between the integrated circuits 12 and the substrate 14. Additionally, the integrated circuits 12 may be enclosed with an encapsulant material (not shown). Although a multi-chip module (MCM) is shown and described, it is to be understood that the package 10 may have only one integrated circuit 12.

Figure 2:
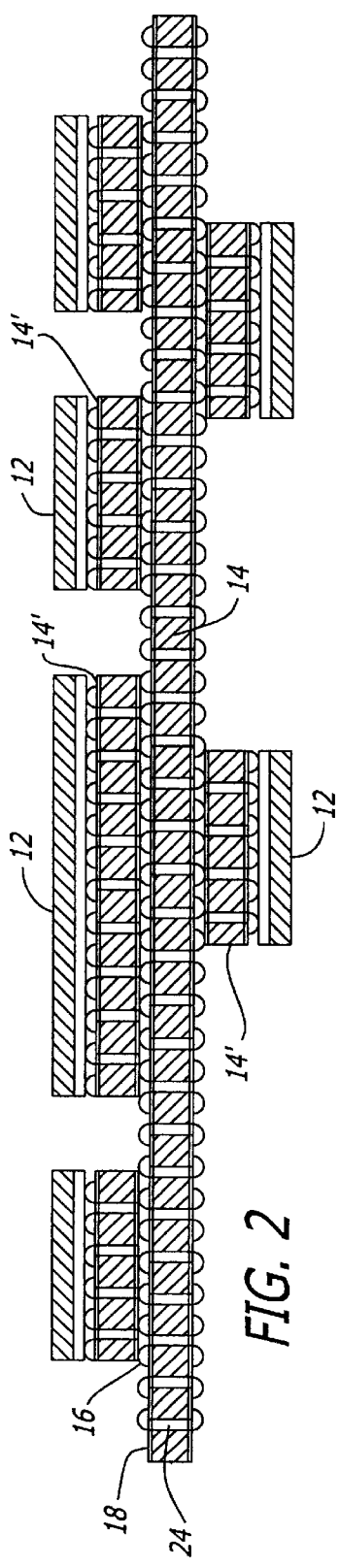
FIG. 2 is a side sectional view of an alternate embodiment of the electronic package.

FIG. 2 shows an alternate embodiment of a package that includes a plurality of integrated circuits 12 connected to a plurality of first silicon substrate/interposers 14'. The first silicon substrate/interposers 14' are connected to the substrate 14. The integrated circuits 12 and substrates 14 and 14' can be connected by solder bumps 16. Each first silicon substrates/interposer 14' "fans out" the contacts of the first integrated circuits 12. The first substrate/interposers 14' allow the substrate 14 to be constructed with a larger bump pitch than the pad pitch of the integrated circuits 12. The large bump pitch improves the manufacturing yield of the substrate 14. The substrates 14 and 14' may include interconnect layers 18, vias 24, etc. to interconnect the integrated circuits 12.

Figure 3:
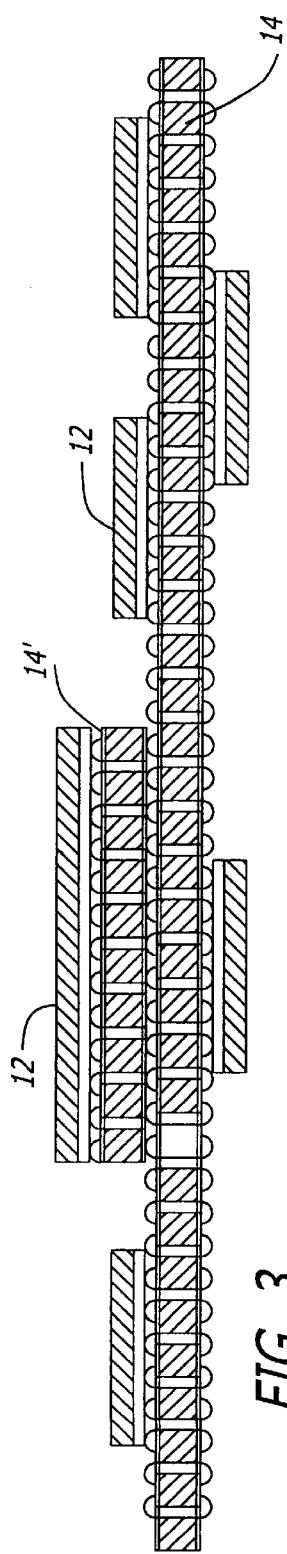
FIG. 3 is a side sectional view of an alternate embodiment of the electronic package.

FIG. 3 shows another embodiment of a package which has a integrated circuit 12 that is coupled to the silicon substrate 14 by a silicon substrate/ interposer 14' and a plurality of integrated circuits 12 that are connected directly to the substrate 14. This embodiment may be employed when not all of the integrated circuits 12 need to be fanned out to the substrate 14 by an interposer 14'.

Figure 4A:
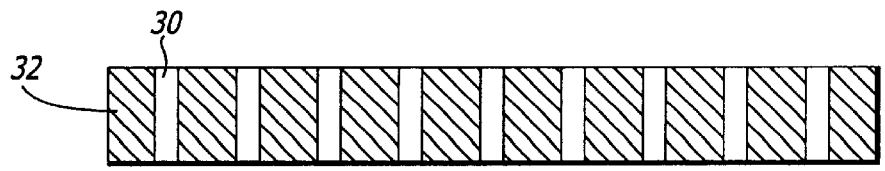
FIGS. 4a–4e are side sectional views showing a process to construct a silicon substrate of the package.
Figure 4B:
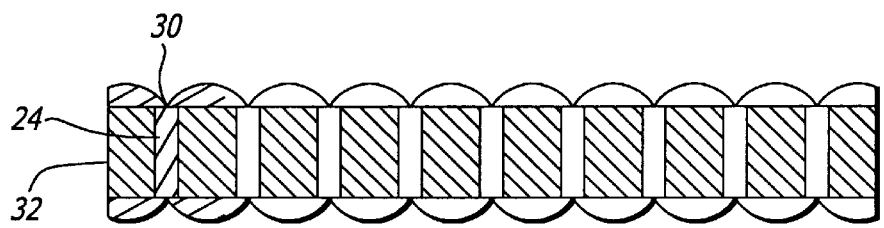

FIGS. 4a–4e show a process for forming the silicon substrate. As shown in FIG. 4a, a plurality of via openings 30 may be formed in a silicon substrate 32. Vias 24 may be formed in the openings 30 as shown in FIG. 4b with known plating processes. Intermediate steps and layers of silicon oxide or silicon nitride, diffusion barriers and plating seeds may be deposited onto the silicon substrate 30 to create the vias 24.

Figure 4C:
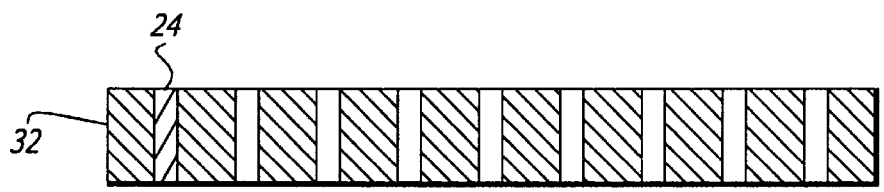
Figure 4D:
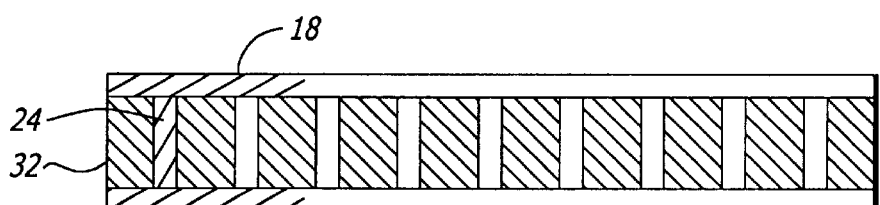
Figure 4E:
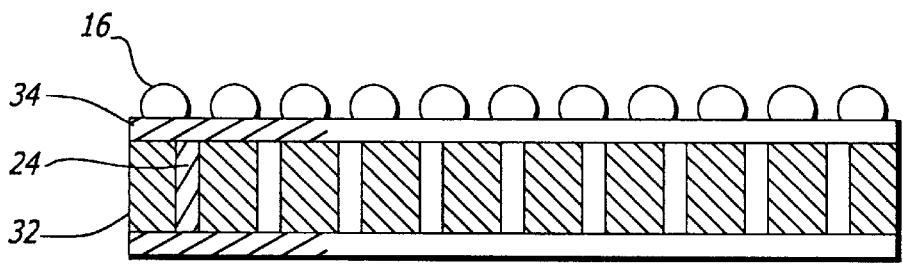

The via filled substrate 32 may be planarized as shown in FIG. 4c. As shown in FIG. 4d, interconnect layers 18 of contact pads, routing traces, etc. may be formed onto the substrate with known plating and etching processes. The solder bumps 16 may then be formed onto the interconnect layers 18 to complete the substrate 14 as shown in FIG. 4e. The process shown in FIGS. 4a–4e can also be used to create the substrate/interposer 14'.

Figure 5:
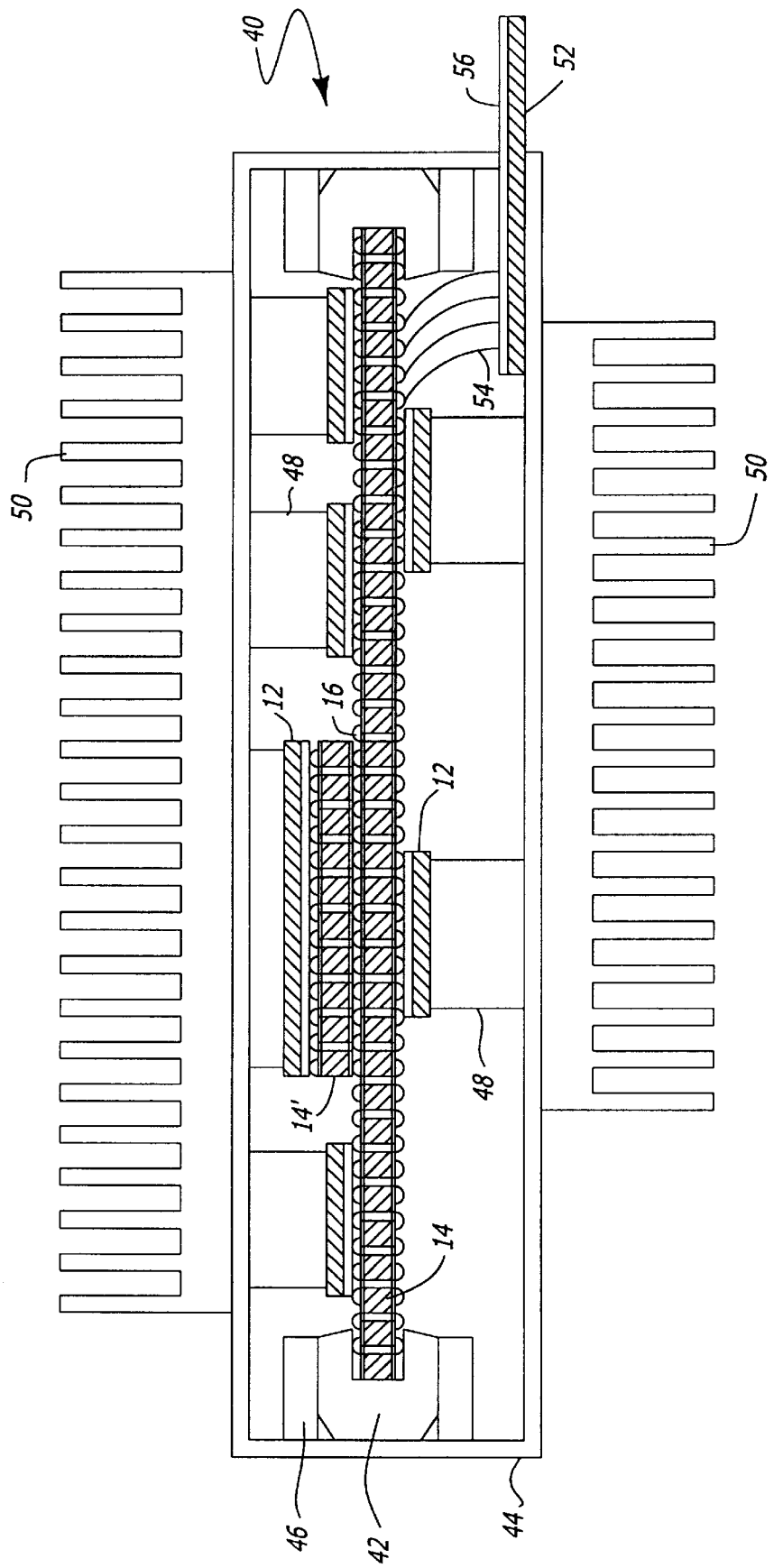
FIG. 5 is a side sectional view of an electronic cartridge.

FIG. 5 shows an embodiment of an electronic cartridge 40. The cartridge 40 may include an integrated circuit 12 that is connected to a substrate 14 by a substrate/interposer 14' and a plurality of integrated circuits 12 connected directly to the substrate 14. The integrated circuits 12 and substrates 14 and 14' may be interconnected by solder bumps 16.

A bumper 42 may be connected to an edge of the substrate 14. The bumper 42 may be attached to a cover 44 by a mount assembly 46. The bumper 42 may be constructed from a damper material such as rubber which isolates the substrate 14 from external shock and vibration loads. The bumper 42 may also protect the edge of the substrate 14 during shipping and handling of the substrate/integrated circuit sub-assembly before the sub-assembly is assembled into the cartridge 40.

The cartridge 40 may contain a plurality of heat spreaders 48 that thermally couple the integrated circuits 12 to the cover 44. A pair of heat sinks 50 may be attached to the cover 44. The heat spreaders 48, cover 44 and heat sinks 50 may all be constructed from thermally conductive material such as aluminum to facilitate the removal of heat from the integrated circuits 12.

The substrate 14 may be connected to a printed circuit board 52 by a plurality of bond wires 54. The circuit board 52 may also be secured to the cover 44. One edge of the printed circuit board 50 may have a plurality of contact pads 56 that can be plugged into a connector (not shown). The connector may be mounted to a motherboard (not shown) of a computer system. The cartridge 40 provides an electronic assembly that can be easily plugged into and detached from an electrical system such as a computer.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:
   a silicon substrate including a via and an interconnect layer that is coupled to said via;
   a first integrated circuit mounted to said silicon substrate;
   a first solder bump that is attached to said silicon substrate and said first integrated circuit and coupled to said interconnect layer;
   a thermal element that is coupled to said first integrated circuit; and
   a bumper that is attached to an edge of said silicon substrate.

2. The package of claim 1, wherein said via extends from a first surface to a second surface of said silicon substrate.

3. The package of claim 1, further comprising a second solder bump that is attached to said second surface of said silicon substrate.

4. The package of claim 1, further comprising a second integrated circuit mounted to said silicon substrate.

5. The package of claim 1, further comprising a silicon substrate interposer mounted to said silicon substrate.

6. The package of claim 5, further comprising a second integrated circuit mounted to said silicon substrate interposer.

7. An electronic cartridge, comprising:
   a silicon substrate which has an edge;
   a first integrated circuit mounted to said silicon substrate;
   a silicon substrate interposer mounted to said silicon substrate;
   a second integrated circuit mounted to said silicon substrate interposer;
   a bumper that is attached to said edge of said silicon substrate;
   a cover that is attached to said bumper; and,
   a printed circuit board connected to said cover and said silicon substrate.

8. The cartridge of claim 7, further comprising a heat spreader that is coupled to said first integrated circuit and said cover.

9. The cartridge of claim 7, wherein said printed circuit board includes a contact pad located at an edge of said printed circuit board.

10. The cartridge of claim 7, further comprising a heat sink mounted to said cover.

11. An integrated circuit package, comprising:
    a silicon substrate including a via;
    a first integrated circuit mounted to said silicon substrate;
    a first solder bump attached to said silicon substrate and said first integrated circuit; and,
    a bumper attached to an edge of said silicon substrate.

12. The integrated circuit package of claim 11, further comprising a silicon substrate interposer mounted to said silicon substrate.

13. The integrated circuit package of claim 11, wherein the bumper is a composition of insulation material.

14. The integrated circuit package of claim 12, further comprising a second integrated circuit mounted to said silicon substrate interposer.

15. The integrated circuit package of claim 13, wherein the insulation material is made of rubber.

* * * * *